United States Patent
Tang et al.

(10) Patent No.: US 10,593,798 B2
(45) Date of Patent: Mar. 17, 2020

(54) VERTICAL TRANSISTOR WITH ONE ATOMIC LAYER GATE LENGTH

(71) Applicant: INTERNATIONAL BUSINESS MACHINES CORPORATION, Armonk, NY (US)

(72) Inventors: Jianshi Tang, Elmsford, NY (US); Qing Cao, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/055,129

(22) Filed: Aug. 5, 2018

(65) Prior Publication Data
US 2020/0044083 A1     Feb. 6, 2020

(51) Int. Cl.
| | |
|---|---|
| *H01L 29/78* | (2006.01) |
| *H01L 29/66* | (2006.01) |
| *H01L 21/308* | (2006.01) |
| *H01L 21/8234* | (2006.01) |
| *H01L 29/417* | (2006.01) |

(52) U.S. Cl.
CPC ...... *H01L 29/7827* (2013.01); *H01L 21/3086* (2013.01); *H01L 21/823412* (2013.01); *H01L 21/823487* (2013.01); *H01L 29/41741* (2013.01); *H01L 29/6656* (2013.01); *H01L 29/66666* (2013.01)

(58) Field of Classification Search
CPC .......... H01L 29/7827; H01L 29/41741; H01L 29/6656; H01L 29/66666; H01L 21/823412; H01L 21/823487; H01L 21/3086
See application file for complete search history.

(56) References Cited

U.S. PATENT DOCUMENTS

| | | | |
|---|---|---|---|
| 5,231,037 A | 7/1993 | Yuan et al. | |
| 5,504,359 A * | 4/1996 | Rodder | H01L 29/1033 |
| | | | 257/302 |

(Continued)

FOREIGN PATENT DOCUMENTS

| | | |
|---|---|---|
| KR | 20120118566 A | 10/2012 |
| WO | 2004/105140 A1 | 12/2004 |
| WO | 2016/071317 A1 | 5/2016 |

OTHER PUBLICATIONS

Geim, A.K. et al., "Van der Waals heterostructures"; Nature (2013); vol. 499; pp. 419-425.

(Continued)

*Primary Examiner* — Sitaramarao S Yechuri
(74) *Attorney, Agent, or Firm* — Intelletek Law Group, PLLC; Gabriel Daniel, Esq.

(57) ABSTRACT

A vertical transistor and a method of creating the same are provided. The vertical transistor has a substrate and a gate comprising a two-dimensional (2D) material on top of the substrate. There is a spacer on top of the gate. There is a gate dielectric comprising (i) a first portion on top of the spacer, (ii) a second portion extending down to a first side surface of the spacer and a side surface of the gate, and (iii) a third portion on top of the substrate. There is a channel comprising three portions. There is a first electrode on top of the first portion of the channel and a second electrode on top of the third portion of the channel.

19 Claims, 6 Drawing Sheets

(56) References Cited

U.S. PATENT DOCUMENTS

| | | | |
|---|---|---|---|
| 6,977,406 B2* | 12/2005 | Kurabayashi | H01L 21/2815 257/302 |
| 7,544,596 B2 | 6/2009 | Ahn et al. | |
| 7,781,827 B2 | 8/2010 | Rao | |
| 8,466,512 B2* | 6/2013 | Masuoka | H01L 21/76804 257/215 |
| 8,471,237 B2 | 6/2013 | Okai et al. | |
| 8,633,055 B2 | 1/2014 | Adkisson et al. | |
| 8,884,345 B2 | 11/2014 | Heo et al. | |
| 9,299,835 B1 | 3/2016 | Anderson et al. | |
| 9,558,939 B1 | 1/2017 | Stephenson et al. | |
| 9,577,049 B1 | 2/2017 | Lin et al. | |
| 9,905,663 B2 | 2/2018 | Cheng et al. | |
| 2002/0145159 A1 | 10/2002 | Ishii et al. | |
| 2002/0163079 A1 | 11/2002 | Awano | |
| 2012/0199815 A1 | 8/2012 | Kondo | |
| 2014/0021446 A1* | 1/2014 | Lee | H01L 29/4908 257/29 |
| 2014/0087191 A1* | 3/2014 | Chua | H01L 21/2007 428/408 |
| 2014/0225066 A1* | 8/2014 | Weber | H01L 21/0485 257/29 |
| 2014/0231752 A1 | 8/2014 | Shin et al. | |
| 2014/0312434 A1* | 10/2014 | Krivokapic | H01L 21/02527 257/410 |
| 2014/0353754 A1* | 12/2014 | Farmer | H01L 29/66477 257/347 |
| 2015/0137075 A1 | 5/2015 | Heo et al. | |
| 2015/0303315 A1* | 10/2015 | Das | H01L 29/78681 257/347 |
| 2016/0043074 A1 | 2/2016 | Hurley et al. | |
| 2016/0087042 A1 | 3/2016 | Lee et al. | |
| 2016/0204162 A1* | 7/2016 | Hu | H01L 27/2436 257/5 |
| 2016/0265047 A1* | 9/2016 | van Rooyen | G01N 27/414 |
| 2016/0336439 A1* | 11/2016 | Lee | H01L 29/78696 |
| 2017/0018555 A1* | 1/2017 | Kwan | G11C 16/16 |
| 2018/0088379 A1* | 3/2018 | Fan | H01L 33/26 |
| 2018/0151763 A1* | 5/2018 | Heo | H01L 31/0324 |
| 2018/0182898 A1* | 6/2018 | Moroz | H01L 29/78 |
| 2018/0219055 A1* | 8/2018 | Bu | H01L 51/102 |
| 2018/0294377 A1 | 10/2018 | Fan et al. | |
| 2019/0074381 A1 | 3/2019 | Park et al. | |
| 2019/0165120 A1* | 5/2019 | Sato | H01L 29/49 |

OTHER PUBLICATIONS

Ma, C. et al., "Seamless Staircase Electrical Contact to Semiconducting Graphene Nanoribbons"; Nano Letters (2017); pp. 6241-6247.

Meersha, A. et al., "Record Low Metal—(CVD) Graphene Contact Resistance Using Atomic Orbital Overlap Engineering"; IEEE (2016); 4 pgs.

Wang, L. et al., "One-Dimensional Electrical Contact to a Two-Dimensional Material"; Science (2013); vol. 342:6158; pp. 614-617.

Britnell, L. et al., "Field-Effect Tunneling Transistor Based on Vertical Graphene Heterostructures"; Science (2012); vol. 335:6071; pp. 947-950.

Georgiou, T. et al., "Vertical Field-Effect Transistor Based on Graphene-WS2 Heterostructures for Flexible and Transparent Electronics"; Nature Nanotechnology (2013); vol. 8, pp. 100-103.

Giannazzo, F., et al., "Vertical Transistors Based on 2D Materials: Status and Prospects"; Crystals (2018); vol. 8:70, pp. 1-25.

Horri, A. et al., "Modeling of a Vertical Tunneling Transistor Based on Graphene-MoS2 Heterostructure"; IEEE Transactions on Electron Devices (2017); vol. 64:8, pp. 3459-3465.

Roy, T. et al., "Field-Effect Transistors Built from All Two-Dimensional Material Components"; ACS Nano (2014); vol. 8:6, pp. 6259-6264.

List of IBM Patents or Applications Treated as Related.

* cited by examiner

VERTICAL TRANSISTOR WITH ONE ATOMIC LAYER GATE LENGTH

BACKGROUND

Technical Field

The present disclosure generally relates to semiconductor devices, and more particularly, to vertical field effect transistors (FETs) having reduced gate length and methods of manufacturing the same.

Description of the Related Art

Over the years, the semiconductor industry has maintained steady improvements in device performance by scaling. Indeed, transistor operating frequency (e.g., cut-off frequency $f_T$) could be increased by scaling its gate and/or channel length, which satisfied various high frequency applications. To maintain performance gains, different technologies are explored. One such technology includes the use of two-dimensional (2D) materials in semiconductor structures.

Two-dimensional materials, sometimes referred to as single-layer materials, are crystalline materials that include a single layer of atoms. One such material is graphene, which is a layer of carbon atoms bonded in a honeycomb crystal lattice. Graphene provides a high carrier mobility at room temperature, low resistivity, and low noise. Some measurements have shown that graphene has a breaking strength 200 times greater than steel, with a tensile strength of 130 GPa. Additionally, graphene has thermal properties comparable to diamond for basal plane thermal conductivity. As to optical properties, graphene can be saturated readily under strong excitation over the visible to near-infrared region, due to the universal optical absorption and zero band gap, which permits application in ultrafast photonics.

SUMMARY

According to one embodiment, a vertical transistor includes a substrate and a gate including a two-dimensional (2D) material on top of the substrate. There is a spacer on top of the gate. There is a gate dielectric that includes (i) a first portion on top of the spacer, (ii) a second portion extending down to a first side surface of the spacer and a side surface of the gate, and (iii) a third portion on top of the substrate. There is a channel that includes (i) a first portion on top of the first portion of the gate dielectric, (ii) a second portion extending down to a first side surface of the second portion of the gate dielectric, and (iii) a third portion on top of the third portion of the gate dielectric. There is a first electrode on top of the first portion of the channel and a second electrode on top of the third portion of the channel.

In one embodiment, there is a first spacer coupled between the gate and the substrate.

In one embodiment, the second portion of the gate dielectric further extends down to a first side surface of the first spacer.

In one embodiment, there is a mask layer between the first portion of the gate dielectric and the spacer.

In one embodiment, the gate length of the vertical transistor is based on a thickness of the gate.

In one embodiment, the first electrode is configured as a source and the second electrode is configured as a drain.

In one embodiment, the side surface of the second electrode is not in contact with a right side surface of the second portion of the channel.

In one embodiment, the 2D material of the gate is graphene.

In one embodiment, the 2D material of the gate has a thickness of a single atomic layer.

According to one embodiment, a method of fabricating a vertical transistor is provided. A substrate is provided and a first spacer is defined on top of the substrate. A gate having a two-dimensional (2D) material is deposited on top of the first spacer. A second spacer is defined on top of the gate. A mask is formed on top of the second spacer. The second spacer, the gate, and the first spacer are removed from areas not protected by the mask. A gate dielectric is deposited, having (i) a first portion on top of the second spacer, (ii) a second portion comprising a first side surface of the second spacer, a first side surface of the gate, and a first side surface of the first spacer, and (iii) a third portion on top of the substrate. A channel is deposited, having (i) a first portion on top of the first portion of the gate dielectric, (ii) a second portion comprising a first side surface of the second portion of the gate dielectric, and (iii) a third portion on top of the third portion of the gate dielectric. A first electrode is formed on top of the first portion of the channel. A second electrode is formed on top of the third portion of the channel.

In one embodiment, the first spacer and the second spacer are each defined using chemical vapor deposition (CVD).

In one embodiment, the gate is synthesized via mechanical exfoliation and growth, followed by transferring.

In one embodiment, the method further includes removing the mask from the top of the second spacer, before depositing the gate dielectric.

In one embodiment, the second spacer, the gate, and the first spacer are removed from areas not protected by the mask, by reactive ion etch (ME).

In one embodiment, the gate length of the vertical transistor is based on a thickness of the gate.

According to one embodiment, another method of fabricating a vertical transistor is provided. An insulating substrate is provided and a gate having a two-dimensional (2D) material is deposited on top of the substrate. A spacer is defined on top of the gate. A mask is formed on top of the spacer. The spacer and the gate are removed from areas not protected by the mask. A gate dielectric is deposited, wherein the gate dielectric has (i) a first portion on top of the spacer, (ii) a second portion having a first side surface of the spacer and a first side surface of the gate, and (iii) a third portion on top of the substrate. A channel is deposited, wherein the channel includes (i) a first portion on top of the first portion of the gate dielectric, (ii) a second portion comprising a first side surface of the second portion of the gate dielectric, and (iii) a third portion on top of the third portion of the gate dielectric. A first electrode is formed on top of the first portion of the channel and a second electrode on top of the third portion of the channel.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a semiconductor substrate or semiconductor body. For example, substrate can be the surface of a wafer or a die.

As used herein, the term "vertical" describes an orientation that is arranged perpendicular to the first surface of the semiconductor substrate or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure relates to vertical field effect transistors (FETs) having reduced gate length and methods of manufacturing the same. The vertical transistor structures discussed herein include ultrathin 2D materials for the gate. The vertical transistor structures discussed herein overcome many of the scaling challenges of traditional planar field effect transistors. By virtue of using a vertical architecture and using 2D materials for the gate, dimensions of the transistor have been further reduced. Further, the gate length is relieved of the traditional lithographic constraints and becomes a function of the width (i.e., thickness) of the 2D gate material. The smaller dimensions of the transistor further improve performance without degrading reliability.

The techniques described herein may be implemented in a number of ways. Example implementations are provided below with reference to the following figures.

Example Vertical Device

Figure 1:
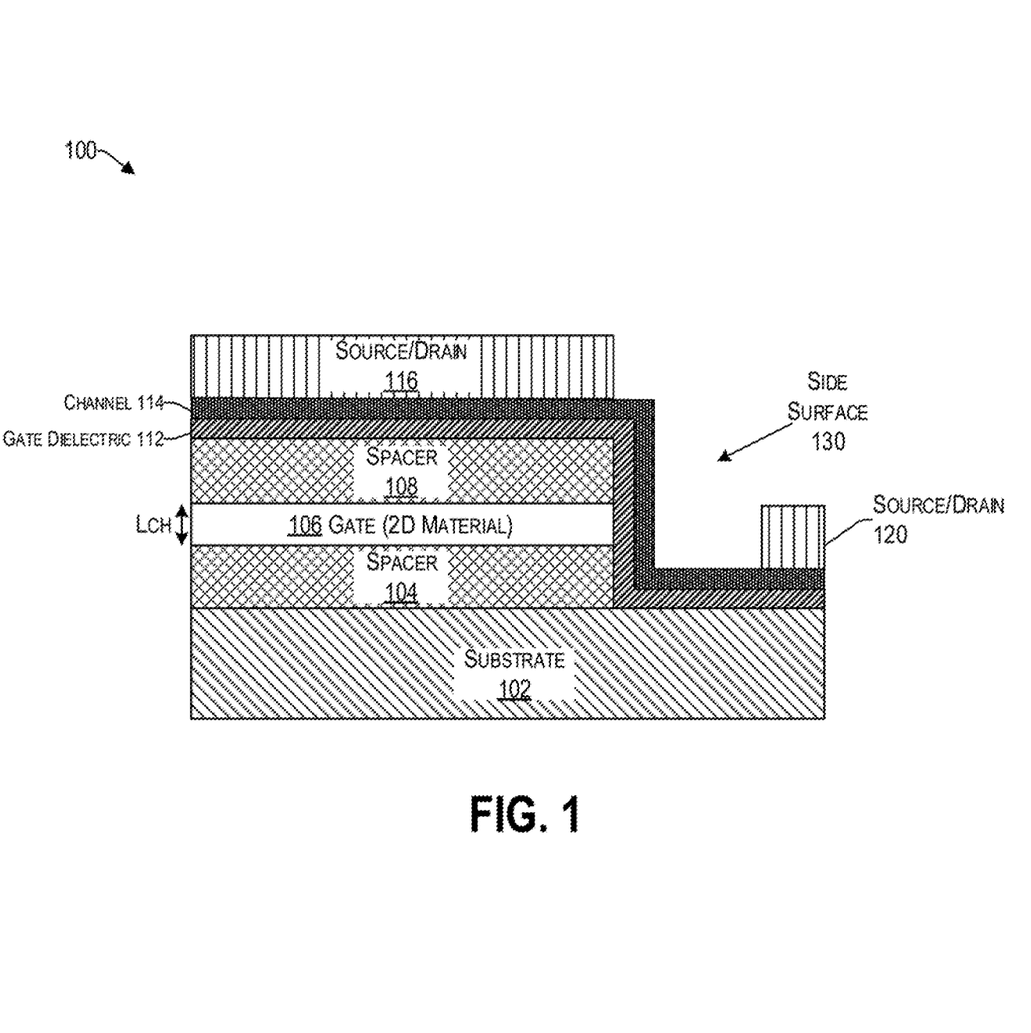
FIG. 1 is a simplified cross-section view of a vertical transistor, consistent with an illustrative embodiment.

Reference now is made to FIG. 1, which is a simplified cross-section view of a vertical transistor, consistent with an illustrative embodiment. The semiconductor structure 100, representing a vertical field effect transistor (FET), may include a substrate 102. In various embodiments, the substrate 102, may comprise any suitable material or combination of materials, such as doped or undoped silicon, glass, dielectrics, etc. For example, the substrate may comprise a semiconductor-on-insulator (SOI) structure, e.g., with a buried insulator layer, or a bulk material substrate, e.g., with appropriately doped regions, typically referred to as wells. In another embodiment, the substrate may be silicon with silicon oxide, nitride, or any other insulating films on top.

Other materials that may be used for the substrate include, without limitation, sapphire, aluminum oxide, germanium, gallium arsenide (GaAs) or any of the other III-V periodic table compounds, indium phosphide (InP), silicon carbide (SiC), an alloy of silicon and germanium, etc. The substrate 102 can act as a conductor or an insulator, depending on the materials and concentrations chosen. Thus, as used herein, the term substrate 102 refers to a foundation upon which various semiconductor structures can be built.

In one embodiment, there is a first spacer 104 located on top of the substrate 102. The first spacer 104 is configured to insulate the 2D material 106 from the substrate 102. In this regard, it is noted that in embodiments where the substrate is itself insulating (e.g., has an SOI configuration), the first spacer 104 is optional. Stated differently, the gate 106 may be coupled directly to the substrate 102.

The first spacer 104 may comprise any suitable material, such as oxides, nitrides, or any other insulating material. In one embodiment, the spacer may comprise an insulator, such as hexagonal boron nitride (hBN), that has a thickness that is approximately 1nm or smaller.

There is a gate layer 106 comprising a 2D material. Single layer materials, sometimes referred to as conductive 2D materials, are crystalline materials having a single layer of atoms. In one embodiment, such 2D material may comprise a single layer of graphite. Other 2D materials may include, without limitation, isolated monolayers and few-layer crystals of black phosphorus, molybdenum disulfide ($MoS_2$), and other dichalcogenides and layered oxides. Thus, in various embodiments, the gate layer 106 may comprise 2D material such as monolayers and few-layer crystals of graphene, black phosphorus, molybdenum disulfide ($MoS_2$), and other dichalcogenides and layered oxides.

As illustrated in FIG. 1, the gate length of the semiconductor structure 100 is determined by the thickness of the gate layer 106 ($L_{CH}$). The thickness of the gate layer ($L_{CH}$) may be chosen based on the particular transistor requirements. The 2D material of the gate 106 may be a single layer of graphene that has a thickness as small as approximately 0.3 nm. Such small dimension may be better appreciated in reference to a regular (i.e., horizontal FET), where the gate or channel length is defined by lithography, the scaling of which is presently limited to an order of magnitude longer (e.g., approximately 10 nm).

There is a second spacer 108 located on top of the gate 106. The second spacer is configured to insulate the gate 106 from the gate dielectric 112. The second spacer 108 may comprise a material similar to those discussed in the context of the first spacer 104. In various embodiments, the first spacer and the second spacer may comprise identical material or different materials. In one embodiment, the second spacer 108 has a smaller thickness than that of the first spacer 104. In this way, the insulation and capacitance between the layers can be better controlled.

In one embodiment, the second spacer 108 is not included, thereby rendering it optional. For example, the gate dielectric 112 may already isolate the gate 106 from the channel 114. However, the presence of the second spacer 108 may help reduce the parasitic capacitance between the gate and the first electrode (i.e., source/drain) 116.

In one embodiment there is an etching mask layer on top of the second spacer 108 (not shown), which may be retained from an etching process to reduce the source/drain 116 to gate 106 capacitance.

There is a gate dielectric layer 112 having three portions. In various embodiments, the first portion of the gate dielectric 114 is on top of the spacer 108 or the mask layer (when retained), which is parallel to the substrate 102. The second portion of the gate dielectric 112 is on a first side surface of the mask layer (if retained), a first side surface of the second spacer 108, a first side surface of the gate 106, and a first side surface of the first spacer 104 (if present), collectively referred to herein as a side surface 130 of the semiconductor structure 100. In one embodiment, there is a third portion of the gate dielectric 112 that is a top surface of the substrate 102.

The gate dielectric 112 may comprise any suitable one or more semiconductor materials or combinations thereof. For example, the gate dielectric 112 may comprise $Al_2O_3$, $HfO_2$, SiN, polymer (e.g., NFC, ZEP520a, etc.), hBN or any combination thereof. The gate dielectric 114 may have a physical thickness of about 2 nm to about 20 nm, although other thicknesses, materials, and/or formation processes may be used within the scope of the present disclosure.

There is a channel 114 comprising three portions. The first portion of the channel 114 is on top of the first portion of the gate dielectric layer 112, while the second portion is on a side surface of the second portion of the gate dielectric layer 112. In one embodiment, there is a third portion of the channel 114 that is on top of the third portion of the gate dielectric 112. The channel 114 may comprise any suitable one or more semiconductor materials or combinations thereof. In one embodiment, the channel 114 can be a 2D material, such as monolayers and few-layer crystals of graphene, black phosphorus, molybdenum disulfide ($MoS_2$), and other dichalcogenides and layered oxides. Other materials that may be used for the channel include, without limitation, organic semiconductors, oxide semiconductors, silicon, germanium, gallium arsenide (GaAs) or any of the other III-V periodic table compounds, indium phosphide (InP), silicon carbide (SiC), an alloy of silicon and germanium, etc.

There is a first electrode 116 and a second electrode 120 that are configured to operate as the source or drain, respectively. For example, the first electrode 116 may be a source and the second electrode 120 may be the drain of the semiconductor structure 100, while in other embodiments, the function of the first electrode 116 and the second electrode 120 is reversed. The first electrode 116 is located on top of the first portion of the channel 114, whereas the second electrode 120 is located on top of the third portion of the channel 114. The first and second electrodes 116 and 120 are electrically conductive and may comprise any suitable material or combination of materials. For example, the first and second electrodes 116 and 120 may comprise graphene, aluminum (Al), titanium (Ti), platinum (Pt), and/or gold (Au), or a combination thereof.

As illustrated in FIG. 1, the salient portions of the semiconductor structure 100 form a field effect transistor (FET) built upward from the horizontal top plane of the substrate 102, rather than being horizontally planar on the top plane of the substrate 102, thereby creating a vertical transistor (i.e., instead of a conventional planar transistor). In various embodiments, the semiconductor structure 100 can be a accumulation mode FET or (preferably) a depletion-mode FET. When configured in depletion-mode, the vertical semiconductor structure 100 is normally ON at a zero gate 106 to source electrode (e.g., 116) bias. For example, semiconductor structure 100 can be used as a load "resistor" in logic circuits (e.g., depletion-load NMOS logic). When configured as an N-type depletion-load transistor, the threshold voltage might be, for example, approximately −3V, which can be turned OFF by pulling the gate 3V negative (e.g., the drain (e.g., 120), by comparison, is more positive than the source (e.g., 116) when configured as an NMOS). When the semiconductor structure 100 is configured as a PMOS, the polarities are reversed.

The vertical semiconductor structure 100 of FIG. 1 can have a very small footprint (e.g., having a vertical length of 10 nm or even smaller). By virtue of using a vertical structure, more transistors can be provided in a given area on the substrate 102. Further, by using 2D material for the gate electrode, and by having a gate length that is a function of the thickness Lch of the gate 106, the dimensions of the vertical transistor are further reduced, thereby reducing parasitic components and improving speed.

Example Process for a Vertical Transistor

Figure 2:
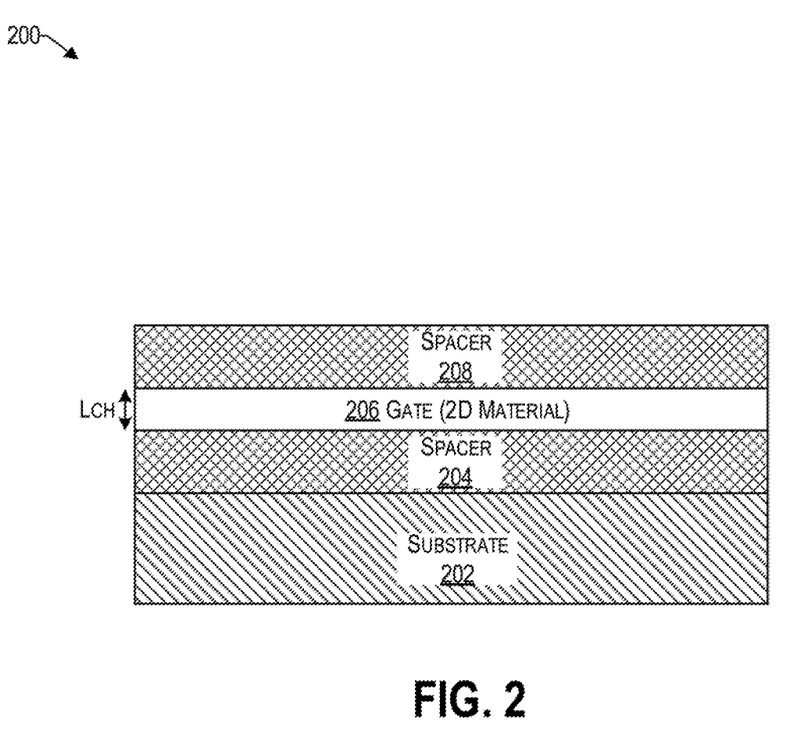
FIG. 2 illustrates a semiconductor structure that has undergone some semiconductor processing steps.

With the foregoing description of the structure of an example vertical semiconductor structure 100, it may be helpful to discuss an example process of manufacturing the same. To that end, FIGS. 2 to 6 illustrate various steps in the manufacture of a vertical transistor, consistent with exemplary embodiments. In particular, FIG. 2 illustrates a semiconductor structure 200 that has undergone some semiconductor processing steps. The process begins with a substrate 202, which may be insulating. The substrate may comprise any suitable material or combination of materials, such as doped or undoped silicon, glass, etc.

In one embodiment, the substrate may comprise a semiconductor-on-insulator (SOI), e.g., with a buried insulator layer, or a bulk material substrate. The insulator layer (not shown) may comprise any suitable electrical insulator material, such as $SiO_2$, SiN, etc., and may be formed using conventional semiconductor processing techniques, such as thermal oxidation, chemical vapor deposition (CVD), physical vapor deposition (PVD), electrochemical deposition (ECD), molecular beam epitaxy (MBE), atomic layer deposition (ALD), etc.

Next, a first spacer 204 is defined, followed by a gate 206, and a second spacer 208 of the transistor. In one embodiment, if the substrate has an insulating property, the first spacer layer 204 is omitted.

The spacers 204 and 208 may comprise any suitable material, such as oxides, nitrides, etc. For example, a silicon oxide film using a conventional deposition processes, such as a chemical vapor deposition (CVD) method may be used. The first spacer 204 and the second spacer 208 may comprise identical material or of different materials. In one embodiment, the second spacer 208 has a smaller thickness than that of the first spacer 204.

In some embodiments, when building devices by stacking layers that may include 2D materials, mechanical exfoliation and growth followed by transferring can be used. Other possible synthesis methods include chemical exfoliation, hydrothermal synthesis, and thermal decomposition. In other embodiments, the 2D material of the gate 206 can be grown on the material below it (e.g., the first spacer 204 or directly on the substrate 202).

Figure 3A:
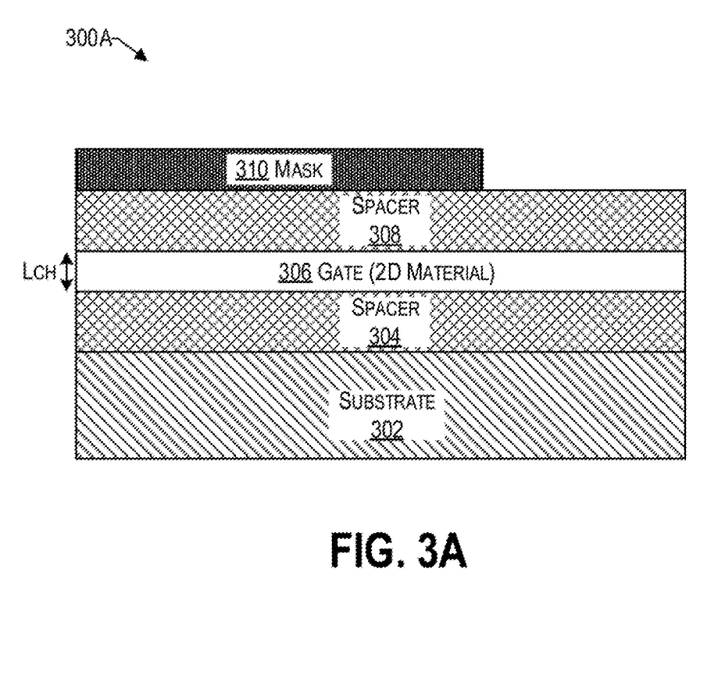
FIG. 3A shows the formation of an etching mask layer of a vertical transistor, consistent with an illustrative embodiment.
Figure 3B:
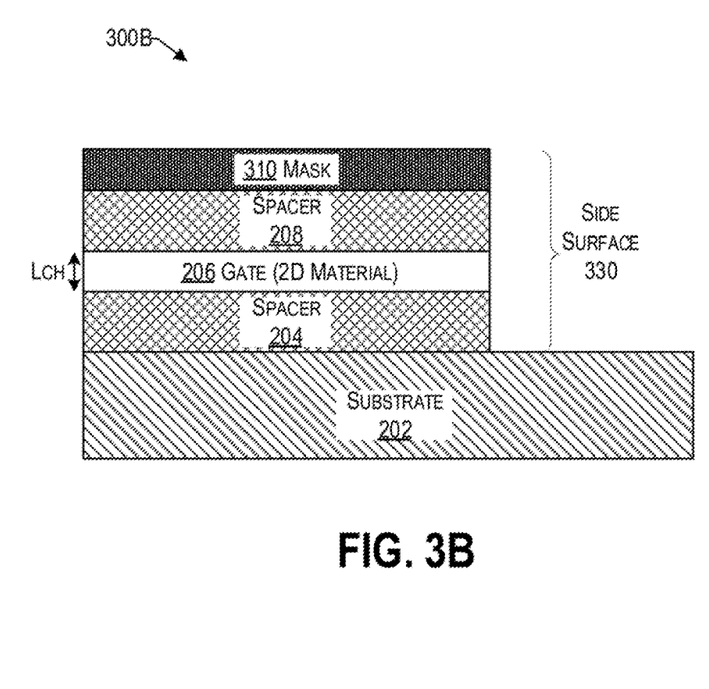
FIG. 3B shows the removal of various layers of a vertical transistor that are not protected by the etching mask layer of FIG. 3A, consistent with an illustrative embodiment.

Reference now is made to FIGS. 3A and 3B, which shows the formation of an etching mask layer 310, and the removal of layers that are not protected thereby, consistent with illustrative embodiments. For example, as is understood by those of ordinary skill in the art, a mask layer 310, sometimes referred to as a photomask, may be provided by forming a layer of photoresist material on the second electrode layer 208, exposing the photoresist material to a pattern of light, and developing the exposed photoresist material. An etching process, such as a reactive ion etch (ME), may be used to form patterns (e.g., openings) by removing portions of the second electrode 208, spacer 206 and first electrode 204, up to the top surface of the substrate 202, thereby creating a side surface 330 of the vertical transistor 300. After etching, the mask layer 310 may be removed using a conventional plasma ashing or stripping process. Accordingly, the pattern of the mask layer 310 facilitates the removal of the second spacer 208, the gate 206, and the spacer 204, in areas where the mask layer 310 has not been deposited.

In one embodiment, the amount (e.g., percentage) of the removal of the mask 310 may be based on the density of the mask 310 (percentage of opening versus coverage) to prevent the mask 310 from crushing one or more layers below it or inducing a curvature thereon, due to the mask 310 weight or the mask residual stress that is multiplied by a continuous mask 310 area. The heavier the mask (e.g., due to its total thickness), and/or the higher the residual mask stress, the wider and/or more numerous the openings may be. In some embodiments, patterned dielectrics, such as oxide or nitride, can be used as the mask layer 310, and in some embodiments, the mask layer 310 is retained (i.e., not removed) at predetermined regions of the transistor to reduce the first electrode 116 (e.g., source/drain) to gate capacitance, by increasing the spacing between the second electrode 208 and the gate 106. The formation of the first and second electrodes 116 and 120 is discussed later in the context of FIG. 6.

Figure 4:
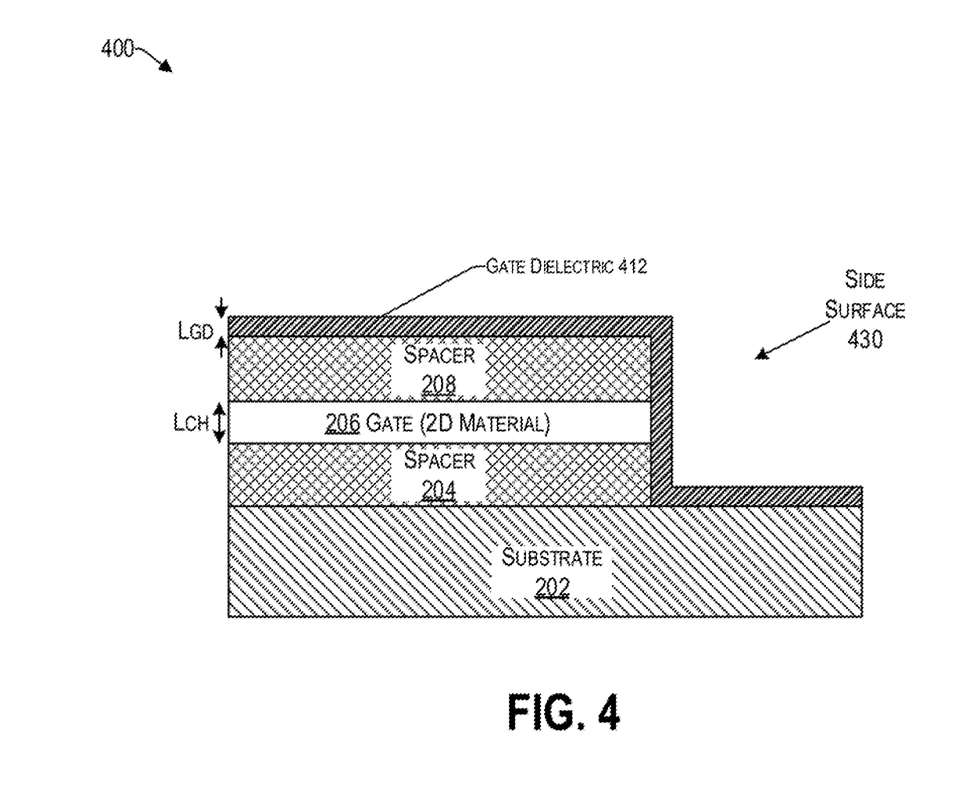
FIG. 4 shows the formation of a gate dielectric of a vertical transistor, consistent with an illustrative embodiment.

Reference now is made to FIG. 4, which shows the formation of a gate dielectric 414 of a vertical transistor 400, consistent with an illustrative embodiment. The first portion of the gate dielectric 414 is deposited on top of the second spacer 208 (i.e., parallel to the substrate 202). The second portion of the gate dielectric 412 is deposited on the side surface 430 of the transistor 400 being fabricated, including the first side surface of the second spacer 208, the first side surface of the gate 206, and the first side surface of the first spacer 204 (if implemented). In one embodiment, a third portion of the gate dielectric 412 is deposited on top of the surface of the substrate 202 (e.g., that was exposed by a prior etching process.)

The gate dielectric 412 may comprise any suitable material including, but not limited to, hexagonal boron nitride (hBN), $Al_2O_3$, $HfO_2$, SiN, polymer (e.g., NFC, ZEP520a, etc.), or any combination thereof. The gate dielectric 412 may be formed using conventional semiconductor processing techniques including, but not limited to, atomic layer deposition (ALD), e.g., for $Al_2O_3$ and/or $HfO_2$, plasma enhanced chemical vapor deposition (PECVD), e.g., for SiN, and spin-coating, e.g., for polymers. The resulting thickness LGA of the gate dielectric 412 may about 2 nm to about 20 nm, although other thicknesses, materials, and/or formation processes may be used depending on the application of the transistor 400.

Figure 5:
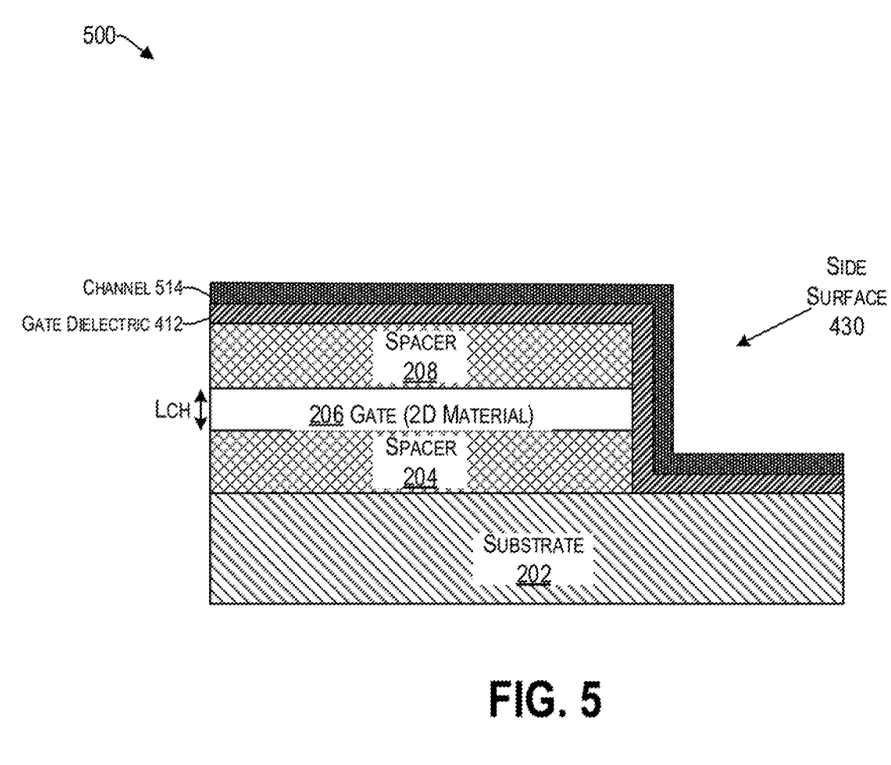
FIG. 5 which shows the formation of a channel of a vertical transistor, consistent with an illustrative embodiment.

FIG. 5 shows the formation of a channel 514 of a vertical transistor 500, consistent with an illustrative embodiment. A first portion of the channel 514 is deposited on the first portion of the gate dielectric 412. The second portion of the channel 514 is deposited on a first side surface of the second portion of the gate dielectric 412. In one embodiment, there is a third portion of the channel 514 that is on top of the third portion of the gate dielectric 412. The channel 514 can comprise any suitable semiconductor one or more materials or combinations thereof. In one embodiment, the channel 514 can comprise one or more 2D materials, such as monolayers and few-layer crystals of graphene, black phosphorus, molybdenum disulfide ($MoS_2$), and other dichalcogenides and layered oxides. Other materials that may be used for the channel include, without limitation, organic semiconductors, oxide semiconductors, silicon, germanium, gallium arsenide (GaAs) or any of the other III-V periodic table compounds, indium phosphide (InP), silicon carbide (SiC), an alloy of silicon and germanium, etc.

In various embodiments, the channel 514 may be deposited by exfoliation then transfer, CVD, spin coating, or any other suitable method. In one embodiment, the channel region is patterned. Stated differently, the channel is removed in regions that are not essential for the function of the transistor. For example, the channel 514 can be retained in areas of the transistor to connect the first and second spacers 204 and 208, including the gate 206, to maintain the functionality of the transistor 500. However, in other areas (e.g., which don't directly affect the functionality of the transistor), the channel may be removed. In this way, the weight and/or stress from the channel are removed from non-essential portions. Further, by virtue of removing the channel from non-essential regions, cross-talk between transistors (which may be manufactured on the same wafer) can be reduced.

Figure 6:
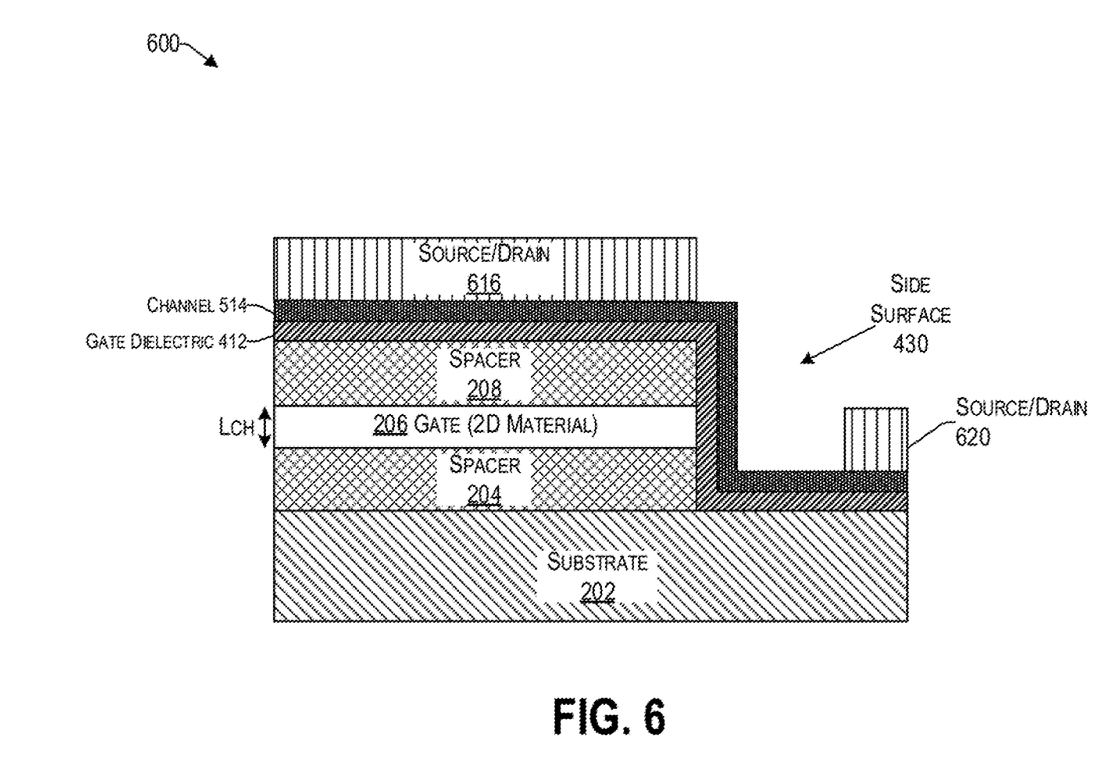
FIG. 6 shows the formation of first and second electrodes of a vertical transistor, consistent with an illustrative embodiment.

FIG. 6 shows the formation of first and second electrodes (616 and 620, respectively) of a vertical transistor 600, consistent with an illustrative embodiment. The first electrode 616 is deposited on top of the first portion of the channel 514, whereas the second electrode 620 is deposited on top of the third portion of the channel 114. In one embodiment, the formation of the first and second electrodes can be patterned by standard lithography process, followed by metal deposition. In another embodiment, shadow deposition using the side surface 430 as a mask can employed to make the distance between the first and second electrodes (i.e., the channel length) as small as possible to reduce the parasitic resistance. In this regard it is noted that, as used herein, the term gate length is defined as the thickness of the 2D material $L_{CH}$, whereas the channel length is based on the spacing (i.e., including both lateral and vertical portions) between the two (i.e., source and drain) electrodes, which could be affected by the patterning method.

The material of the first and second electrodes 616 and 620 is configured to be electrically conductive and may comprise any suitable material or combination of materials. For example, the first and second electrodes 616 and 620 may comprise graphene, aluminum (Al), titanium (Ti), platinum (Pt), and/or gold (Au), or a combination thereof. The first and second electrodes 616 and 620 may be formed using conventional semiconductor processing techniques, such as electron beam evaporation combined with a lift-off process, sputtering. The material of the first and second electrodes 616 and 620 is not limited to the materials and processes described herein. Other suitable materials and/or formation processes are within the scope of the present disclosure.

In one embodiment, the source/drain layer comprising the first electrode 616 and the second electrode 620 is deposited as a single layer comprising a first portion on top of the first portion of the channel 514, a second portion on the first side of the second portion of the channel 514 and a third portion on top of the third portion of the channel 514. Subsequently, portions of this layer are etched away, namely the second portion and part of the third portion, to provide the structure depicted in FIG. 6. The electrode material can be removed via etching. To that end, preferably dry etching is used, while wet etching can be used as well in some scenarios. In this way, the source and drain of the vertical transistor 600 can be created.

While the manufacture of a single transistor is being shown for simplicity, it will be understood that any desired number of transistors can be formed using similar processing steps concurrently in different parts of a substrate and/or wafer. In some embodiments, transistors may be further stacked on top of one another using layers and processing steps similar to those discussed above.

While a structure that has a side surface 430 that is perpendicular to the substrate 202 is illustrated for simplicity, it will be understood that other shapes and angles are supported as well. In various embodiments, the sidewall (i.e., side surface 430) may be arranged at different angles relative to an upper surface of the second electrode 616. For example, one or more layers (e.g., 616, 614, 412, 208, 206, and 204) may have a cross section that is trapezoidal in shape.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

CONCLUSION

The descriptions of the various embodiments of the present teachings have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A vertical transistor, comprising:
   a substrate;
   a gate comprising a two-dimensional (2D) material on top of the substrate;
   a spacer on top of the gate;
   a gate dielectric comprising (i) a first portion on top of the spacer, (ii) a second portion extending down to a first side surface of the spacer and a side surface of the gate, and (iii) a third portion on top of the substrate;
   a channel comprising (i) a first portion on top of the first portion of the gate dielectric, (ii) a second portion extending down to a first side surface of the second portion of the gate dielectric, and (iii) a third portion on top of the third portion of the gate dielectric;
   a mask layer between the first portion of the gate dielectric and the spacer;
   a first electrode on top of the first portion of the channel; and
   a second electrode on top of the third portion of the channel.

2. The vertical transistor of claim 1, further comprising a first spacer coupled between the gate and the substrate.

3. The vertical transistor of claim 2, wherein the second portion of the gate dielectric further extends down to a first side surface of the first spacer.

4. The vertical transistor of claim 2, wherein the first spacer has a thickness that is larger than a thickness of the spacer on top of the gate.

5. The vertical transistor of claim 1, wherein a gate length of the vertical transistor is based on a thickness of the gate.

6. The vertical transistor of claim 1, wherein:
   the first electrode is configured as a source; and
   the second electrode is configured as a drain.

7. The vertical transistor of claim 1, wherein the 2D material of the gate is graphene.

8. The vertical transistor of claim 1, wherein the 2D material of the gate has a thickness of a single atomic layer.

9. The vertical transistor of claim 1, wherein the vertical transistor is configured as a depletion mode device.

10. The vertical transistor of claim 1, wherein the substrate comprises a silicon on insulator structure.

11. A vertical transistor, comprising:
    a substrate;
    a gate comprising a two-dimensional (2D) material on top of the substrate;
    a spacer on top of the gate;
    a gate dielectric comprising (i) a first portion on top of the spacer, (ii) a second portion extending down to a first side surface of the spacer and a side surface of the gate, and (iii) a third portion on top of the substrate;
    a channel comprising (i) a first portion on top of the first portion of the gate dielectric, (ii) a second portion extending down to a first side surface of the second portion of the gate dielectric, and (iii) a third portion on top of the third portion of the gate dielectric;
    a first electrode on top of the first portion of the channel; and
    a second electrode on top of the third portion of the channel, wherein a left side surface of the second electrode is not in contact with a right side surface of the second portion of the channel.

12. A method of fabricating a vertical transistor, comprising:
    providing a substrate;
    defining a first spacer on top of the substrate;
    depositing a gate comprising a two-dimensional (2D) material on top of the first spacer;
    defining a second spacer on top of the gate;
    forming a mask on top of the second spacer;
    removing the second spacer, the gate, and the first spacer from areas not protected by the mask;
    depositing a gate dielectric comprising: (i) a first portion on top of the second spacer, (ii) a second portion comprising a first side surface of the second spacer, a first side surface of the gate, and a first side surface of the first spacer, and (iii) a third portion on top of the substrate;
    depositing a channel comprising: (i) a first portion on top of the first portion of the gate dielectric, (ii) a second portion comprising a first side surface of the second portion of the gate dielectric, and (iii) a third portion on top of the third portion of the gate dielectric;
    forming a first electrode on top of the first portion of the channel; and
    forming a second electrode on top of the third portion of the channel.

13. The method of claim 12, wherein the first spacer and the second spacer are each defined using chemical vapor deposition (CVD).

14. The method of claim 12, wherein the gate is synthesized via mechanical exfoliation and growth, followed by transferring.

15. The method of claim 12, further comprising removing the mask from the top of the second spacer, before depositing the gate dielectric.

16. The method of claim 12, wherein the second spacer, the gate, and the first spacer are removed from areas not protected by the mask by reactive ion etch (RIE).

17. The method of claim 12, wherein a gate length of the vertical transistor is based on a thickness of the gate.

18. The method of claim 12, further comprising:
    configuring the first electrode as a source; and
    configuring the second electrode as a drain.

19. A method of fabricating a vertical transistor, comprising:
    providing an insulating substrate;
    depositing a gate comprising a two-dimensional (2D) material on top of the substrate;
    defining a spacer on top of the gate;
    forming a mask on top of the spacer;
    removing the spacer and the gate from areas not protected by the mask;
    depositing a gate dielectric comprising: (i) a first portion on top of the spacer, (ii) a second portion comprising a first side surface of the spacer and a first side surface of the gate, and (iii) a third portion on top of the substrate;
    depositing a channel comprising: (i) a first portion on top of the first portion of the gate dielectric, (ii) a second portion comprising a first side surface of the second portion of the gate dielectric, and (iii) a third portion on top of the third portion of the gate dielectric;
    forming a first electrode on top of the first portion of the channel; and
    forming a second electrode on top of the third portion of the channel.

* * * * *